US005838061A

United States Patent [19]

Kim

[11] Patent Number: 5,838,061

[45] Date of Patent: Nov. 17, 1998

[54] SEMICONDUCTOR PACKAGE INCLUDING A SEMICONDUCTOR CHIP ADHESIVELY BONDED THERETO

[75] Inventor: Jin Sung Kim, Cheongju, Rep. of Korea

[73] Assignee: LG Semicon Co., Ltd., Cheongju, Rep. of Korea

[21] Appl. No.: 751,615

[22] Filed: Nov. 18, 1996

[30] Foreign Application Priority Data

Mar. 11, 1996 [KR] Rep. of Korea .................... 1996 6372

[51] Int. Cl.[6] ........................... H01L 23/02; H01L 23/34; H01L 23/48

[52] U.S. Cl. .......................... 257/686; 257/685; 257/723; 257/783

[58] Field of Search .................................... 257/783, 723, 257/686, 685

[56] References Cited

U.S. PATENT DOCUMENTS

| | | | |
|---|---|---|---|
| 4,742,385 | 5/1988 | Kohmoto | 2576/723 |
| 5,001,542 | 3/1991 | Tsukagoshi et al. | 257/783 |
| 5,136,365 | 8/1992 | Pennisi et al. | 257/783 |
| 5,290,197 | 3/1994 | Ohnuma et al. | 445/24 |
| 5,381,039 | 1/1995 | Morrison | 257/701 |
| 5,608,261 | 3/1997 | Bhattacharyya et al. | 257/700 |

FOREIGN PATENT DOCUMENTS

| | | | |
|---|---|---|---|
| 60-225439 | 11/1985 | Japan | 257/783 |
| 4-253348 | 9/1992 | Japan | 257/783 |
| 3-323840 | 11/1992 | Japan | 257/783 |
| 4-323838 | 11/1992 | Japan | 257/783 |

*Primary Examiner*—Teresa M. Arroyo
*Attorney, Agent, or Firm*—Fleshner & Kim

[57] ABSTRACT

A semiconductor package of the present invention is light, thin, simple and small, and can have more than 500 pins. The package includes a substrate having a cavity and a plurality of internal leads to serve as an electrical path. A plurality of internal terminals is formed on the bottom of the cavity and is connected to one end of the internal leads. A plurality of external terminals is formed on the bottom surface of the substrate and is connected to the other ends of the internal leads. A conductive adhesive formed on the upper surfaces of the internal terminals, and a semiconductor chip with chip pads is bonded to the upper surfaces of the conductive adhesives. A molded body is formed in the cavity such that the semiconductor chip is surrounded or partially covered. At least one semiconductor chip can be mounted in the cavity.

15 Claims, 7 Drawing Sheets

SEMICONDUCTOR PACKAGE INCLUDING A SEMICONDUCTOR CHIP ADHESIVELY BONDED THERETO

TECHNICAL FIELD

The present invention relates to a semiconductor package, and in particular, to an improved semiconductor package with high pin capacity.

BACKGROUND ART

Recently, a ball grid array (hereinafter, called a BGA) semiconductor package, which is a kind of multi-pin package, is more preferable than a quad flat package (hereinafter, called a QFP). The BGA package can have over twice the number of pins than those of a QFP, with a pitch between the leads to be generally three times wider than that of a QFP.

Since the width of an outlead becomes thinner with an increasing number of pins, the lead becomes curved, and the alignment of the package and the amount of a solder are difficult to control when the QFP is mounted on the surface of a printed circuit board (PCB). The BGA semiconductor package, however, uses a solder ball as an outlead, so that the disadvantages of the QFP can be compensated. In addition, since the electrical path from a semiconductor chip to the solder ball in the BGA semiconductor package is shorter compared to the QFP, the electrical resistance is lower, resulting in excellent electrical characteristics.

FIGS. 1 and 2 illustrate the conventional BGA semiconductor package. On a predetermined upper portion of a substrate 1, a semiconductor chip is mounted using an adhesive 3, and one end of an internal lead (not illustrated) in the substrate is connected to the semiconductor chip 2 through a metal wire 4. A molded body of epoxy molding compound 5 is formed on a predetermined area of the top surface of the substrate 1 such that the semiconductor chip 2 and the metal wire are covered. The bottom surface of the substrate 1, and a plurality of solder balls 6 are bonded in such a manner that the other end of the internal lead (not illustrated) is connected.

FIGS. 2A through 2D are longitudinal cross-sectional views showing the fabrication process of the BGA semiconductor package illustrated in FIG. 1. As shown in FIG. 2A, a die bonding is carried out that the semiconductor chip 2 is bonded at the center of the top surface of the substrate 1 with an adhesive 3. As shown in FIG. 2B, a wire bonding process is performed such that a plurality of chip pads formed on the top surface of the semiconductor chip 2, and one end of the internal lead formed in the substrate 1 are electrically connected with the metal wires 4, respectively. Next, as shown in FIG. 2C, a molding process is carried out such that the semiconductor chip 2 and a predetermined portion of the substrate 1 having the metal wire 4 are molded with an epoxy molding compound. Then, as shown in FIG. 2D, a solder ball bonding is performed such that a plurality of solder balls 6 is bonded on the bottom surfaces such that the other ends of the internal leads (not illustrated) are electrically connected thereto, which results in a conventional completed BGA semiconductor package.

However, the above-described conventional BGA package has many disadvantages. First, there are limits in fabricating the conventional package to be light, thin, simple and small. Second, because the standard diameter of the solder ball 6 is 0.76 mm and its pitch (a distance between adjoining solder balls) is 1.27 mm, there is a limit in minimizing the size of the solder ball 6. Hence, it is nearly impossible to achieve construction of pins of more than 500 with standard solder balls. However, there are solder bumps having a diameter of 350 μm and a pitch of 0.5 mm for semiconductor package having more than 500 pins, but the process is complicated, and the practical automation of high-priced equipment is difficult to achieve.

DISCLOSURE OF THE INVENTION

The present invention is achieved at least in part by a package comprising: a substrate having first and second surfaces and a plurality of leads formed in the substrate, a first cavity being formed on the first surface; a plurality of first terminals formed on the first cavity; a plurality of second terminals formed on the second surface of the substrate, each lead coupling a corresponding first terminal to a corresponding second terminal; a conductive adhesive on a surface of each of the plurality of first terminals; an integrated chip having a plurality of bonding pads, the integrated chip being placed on the conductive adhesive such that a corresponding bond pad is coupled to a corresponding first terminal; and a molding compound filling the first cavity to a predetermined height.

The present invention is also achieved at least in part by an improved semiconductor package which includes a cavity formed in the substrate, a substrate in which a plurality of internal leads serving as an electrical path is provided, a plurality of internal terminals formed at the lower portion of a cavity so that one ends of the internal leads are connected thereto, a plurality of external terminals formed on the bottom surface of the substrate so that the other ends of the internal leads are connected thereto, a conductive adhesive formed on the upper surface of each internal terminal, a semiconductor chip on the bottom surface of which chip pads are bonded to the upper surface of each conductive adhesive to correspond to each other, respectively, and a molding compound in the cavity in such a manner that the semiconductor chip is wrapped therein.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
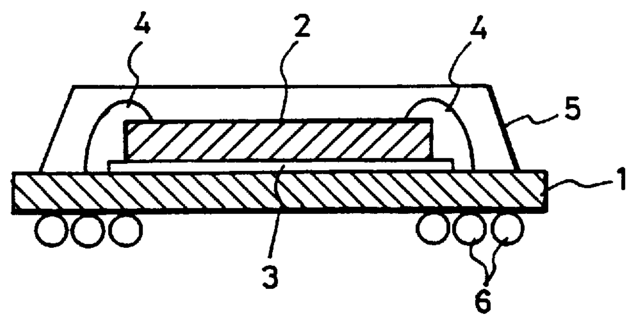
FIG. 1 is a longitudinal cross-sectional view of a conventional BGA semiconductor package.
Figure 2A:
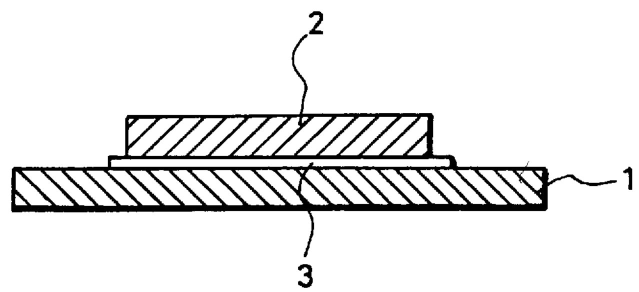
FIGS. 2A through 2D are longitudinal cross-sectional views of a fabrication process for the BGA semiconductor package illustrated in FIG. 1.
Figure 2B:
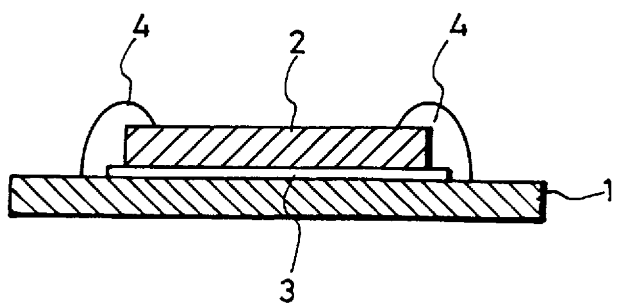
Figure 2C:
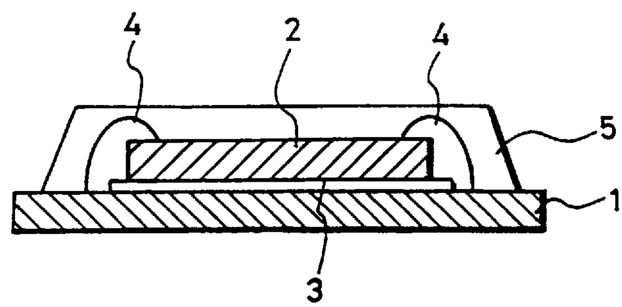
Figure 2D:
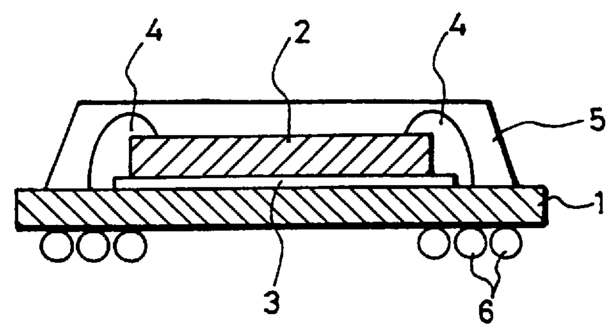
Figure 3:
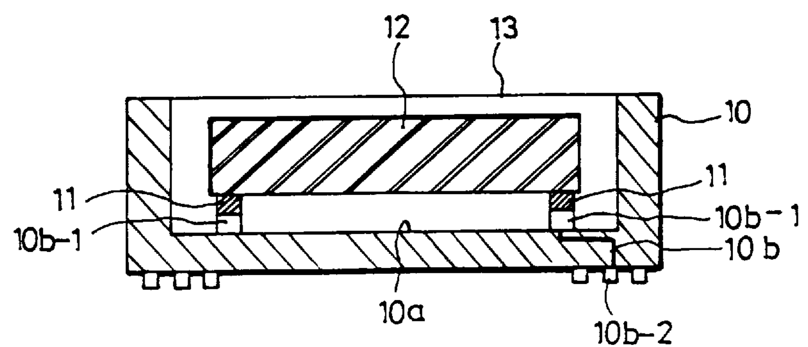
FIG. 3 is a longitudinal cross-sectional view of a semiconductor package according to an embodiment of the present invention.
Figure 4A:
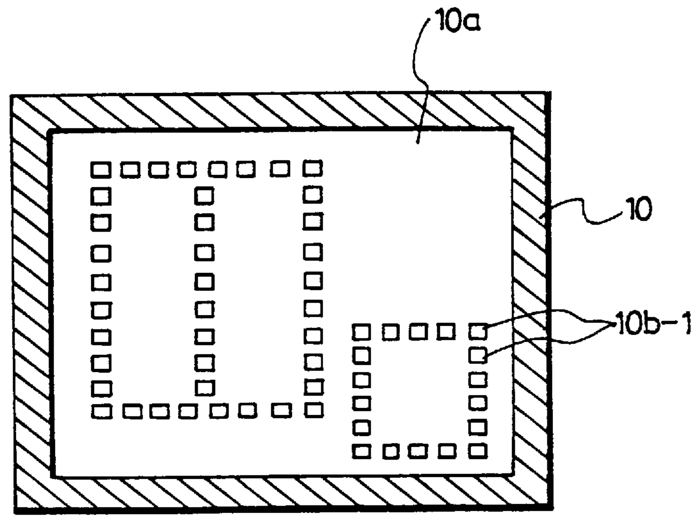
FIGS. 4A and 4B are, respectively, a planar view and a bottom view showing a substrate of a semiconductor package according to an embodiment of the present invention.
Figure 4B:
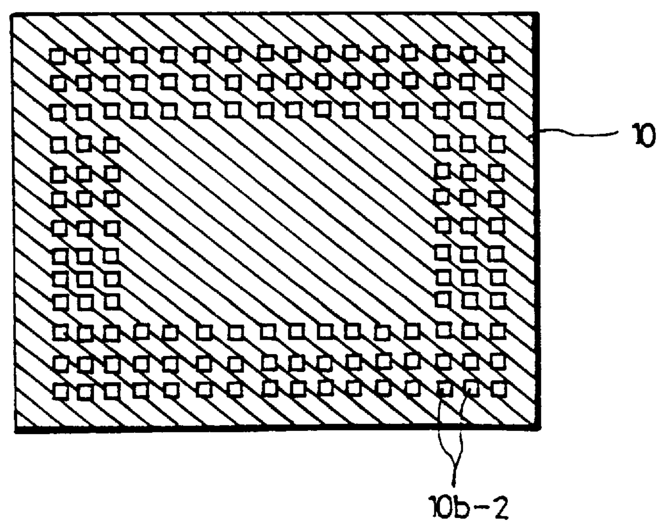

As shown in FIG. 3, a cavity 10*a* is formed at the center of the top surface of a substrate 10 and internal terminals 10*b*-l and external terminals 10*b*-2 are respectively connected to both the ends of a plurality of internal leads 10*b* provided on the bottom of the substrate 10 to serve as an electrical path. The internal leads 10*b* are provided on the top surface of the substrate 10 comprising the bottom surface of the cavity 10*a*, with multi-layers of copper wires. At the bottom of the cavity 10*a*, a plurality of internal terminals 10*b*-1 having a protrusion structure are connected to one end of the internal leads 10*b*.

A conductive adhesive 11 is applied on the upper surfaces of the internal terminals 10*b*-1. On the upper surface of the conductive adhesive 11, a chip pad is bonded thereto so as to mount a semiconductor chip 12 facing each other. And a molded body 13 is formed to surround the semiconductor chip 12 in the cavity 10*a*. Copper (Cu) is used as a material for the internal and external terminals 10*b*-l, 10*b*-2, and by planting Au or Ni layer on the above material, the adhesive strength can be enhanced. An anisotropic conductive adhesive (ACA) or an anisotropic conductive film (ACF) is used as the conductive adhesive 11.

Each internal terminal 10*b*-1, having a protrusion structure, has a thickness of 5 to 100 μm and each external terminal 10*b*-2 has a thickness of 10 to 400 μm. At least 10 μm distance is placed between each adjoining external terminal 10*b*-2, and the preferable area of each internal and external terminal 10*b*-1, 10*b*-2 is more than 0.2 mm×0.2 mm.

The plurality of internal terminal 10*b*-1, serving as a mounting portion for the semiconductor chip 12, is formed on the top surface of the substrate 10 in consideration of an electrical connection to a plurality of chip pads formed at the semiconductor chip 12. In addition, each chip pad in the semiconductor 12 and each internal terminal 10*b*-1 are bonded by a thermo-compression bonding, using the conductive adhesive 11 made of ACA or ACF.

Figure 5A:
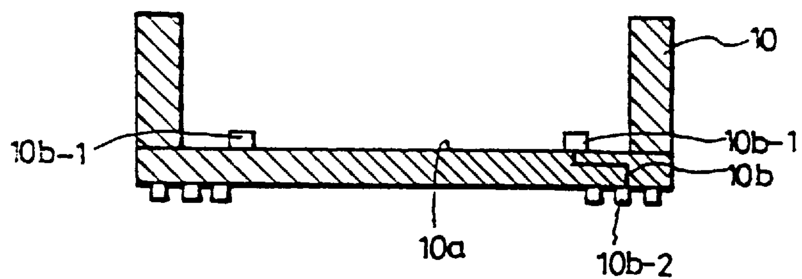
FIGS. 5A through 5D are longitudinal cross-sectional views of a fabrication process for a semiconductor package according to an embodiment of the present invention.
Figure 5B:
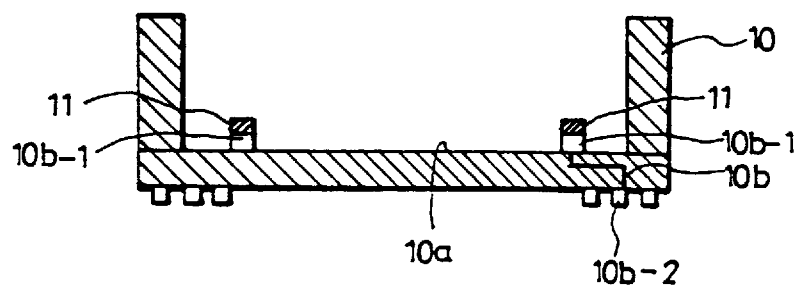

FIGS. 5A through 5D show a fabrication process for a semiconductor according to the present invention in FIG. 3. As shown in FIG. 5A, internal leads 10*b* are provided, and the cavity 10*a* is formed at the center of the top surface of the substrate 10. A plurality of the internal and external terminal 10*b*-1, 10*b*-2 is formed on the top and bottom surfaces of the substrate 10 such that both ends of the internal leads 10*b* are connected thereto, respectively.

Figure 5C:
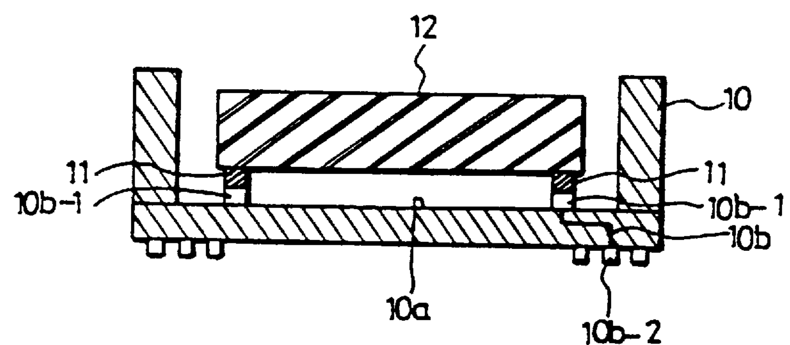

Next, after the conductive adhesive 11 is applied on the upper surface of each internal terminal 10*b*-1 (see FIG. 5B), the chip pads formed at the semiconductor chip 12 are arranged to correspond to the upper surface of the conductive adhesive 11, as shown in FIG. 5C. The semiconductor chip 12 is then bonded to the conductive adhesive 11 by a thermo-compression bonding. The above-described process is labelled as an ACA/ACF bonding or a bumpless process. Such bonding processes will be described in more detail below.

Figure 5D:
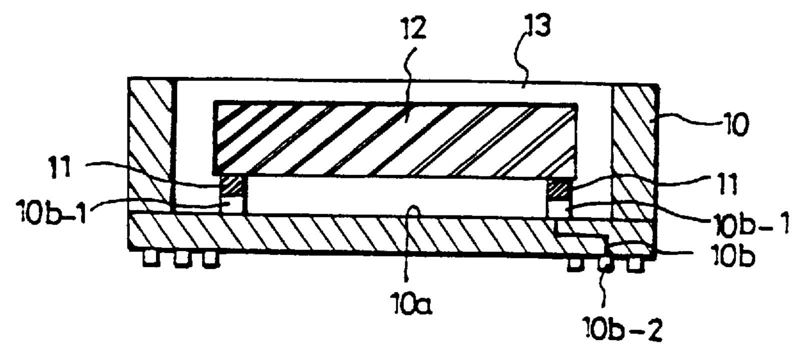

The conductive adhesive 11 of ACA or ACF is applied on the upper surface of the internal terminal 10*b*-l, and an align key in the shape of "+" or "□" (or other appropriate shaped align keys) is formed on the chip pads formed at the semiconductor chip 12 and on a predetermined portion of the internal terminals 10*b*-1 formed on the substrate 10. Then position data of upper and lower align keys are combined at a computer having a flip chip disclosed therein, using a CCD camera, and the chip pads formed at the semiconductor chip 12 which correspond to the conductive adhesive 11 are aligned and arranged. A bonding process is carried out using a thermo compression. The internal terminals 10*b*-1, having a protrusion structure, serve as bumps of the chip pad. When the bonding process is finished, as shown in FIG. 5D, a molded body 13 is formed by dispensing or transfer-molding the cavity 10*a* with an epoxy molding compound so that the semiconductor chip 12 is surrounded, to complete the fabrication process for a semiconductor package.

Figure 6:
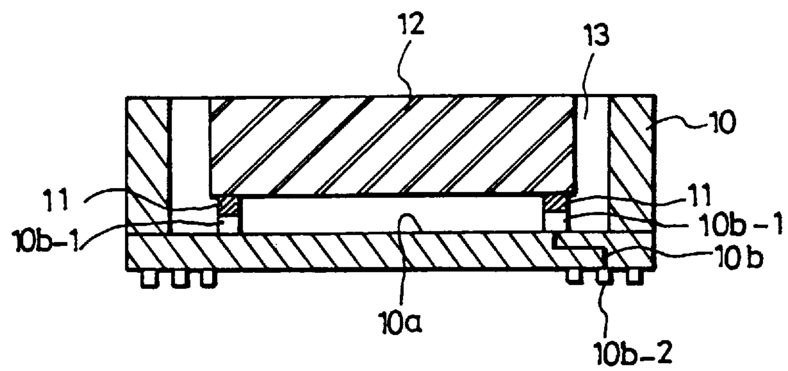
FIG. 6 is a longitudinal cross-sectional view of a semiconductor package in accordance with another embodiment of the present invention.

FIG. 6 shows a modification of FIG. 3. As shown, the effect of a heat emission can be maximized by forming the molded 13 in such a manner that the upper surface of the semiconductor chip 12 is exposed and thereby making a heat emission easy. As can be appreciated, the molded body 13 can be formed such that top and predetermined portions of the sides are exposed to further maximize heat emission.

Figure 7:
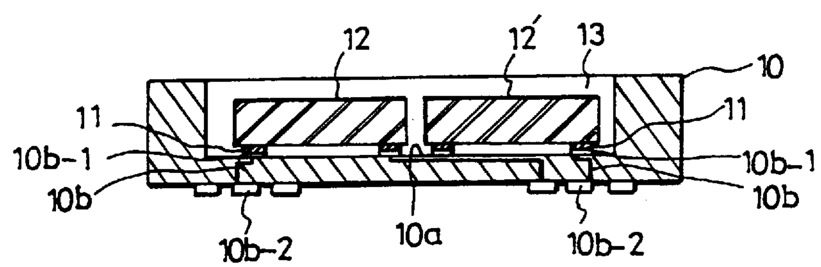
FIG. 7 is a longitudinal cross-sectional view of a semiconductor package in accordance with another embodiment of the present invention.
Figure 8:
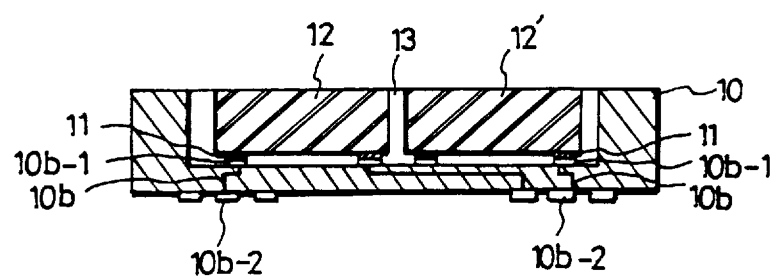
FIG. 8 is a longitudinal cross-sectional view of a semiconductor package in accordance with another embodiment of the present invention.

FIG. 7 shows a modification of FIG. 3. As shown, an integrated package is formed by mounting two semiconductors 12, 12' in the cavity 10*a*. At least two semiconductor chips can be mounted in the cavity 10*a*. FIG. 8 shows a modification of FIG. 7. As shown, the molded body 13 is formed such that the upper surface of the semiconductor chips 12, 12' provided in the cavity 10*a* are exposed to maximize the effect of a heat emission.

Figure 9:
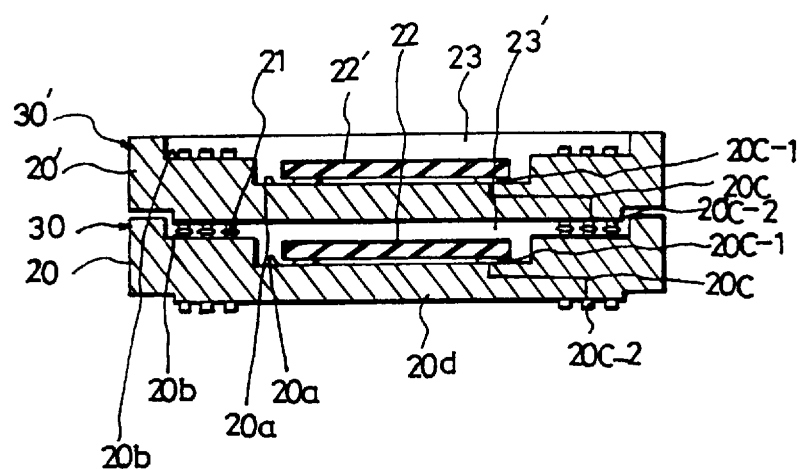
FIG. 9 is a longitudinal cross-sectional view of a semiconductor package according to another embodiment of the present invention.

FIG. 9 shows a construction of a semiconductor package according to another embodiment of the present invention. In this embodiment, the semiconductor package has a substrate 30 with a stepped cavity having a bottom surface 20*a* and a stepped surface 20*b*. Also, the lower surface of the substrate 30 is stepped to form a stepped lower surface 20*d*. A plurality of internal and external terminals 20*c*-1, 20*c*-2 is connected to each other through a plurality of internal leads 20*c* formed in the substrate 20. The substrate 20', identical to the substrate 20, is placed on top thereto, and many additional substrates may be placed thereon to form a semiconductor package having a stacked structure. A conductive adhesive 21 is applied on the upper surface of the internal terminal 20*c*-1, and semiconductor chips 22, 22' are bonded on the upper surface of the conductive adhesive 21. A molded body 23 is formed so that the semiconductor chip 22, 22' are surrounded, respectively, or may be partially exposed.

As shown in FIG. 9, depicting two semiconductor packages stacked on top of each other, semiconductor chips 22, 22' are mounted on the bottom surfaces of the stepped cavity in each semiconductor package. The lower stepped surface 20*d* of one semiconductor package fits onto the stepped cavity of another semiconductor package when the two packages are stacked together.

A plurality of internal leads 20*c*, serving as a second electrical path, is provided in the substrates 20, 20'. A plurality of internal terminals 20*c*-1 is formed on the bottom of the stepped cavity, and each internal terminal 20*c*-1 is connected to one end of a corresponding internal lead 20*c*. A plurality of external terminals 20*c*-2, connected to the other ends of the internal leads 20*c*, respectively, is formed on the surface of the stepped lower surface 20*d* of the semiconductor package.

The conductive adhesive 21 is applied on the upper surfaces of the internal terminals 20*c*-1, and corresponding chip pads of the semiconductor chips 22, 22' are bonded to corresponding internal terminals 20*c*-1 formed on the bottom of the first cavity. When the two substrates 20, 20' are stacked, the external leads 20*c*-2 formed on the protrusion 20*d* of a semiconductor package 30' are bonded with the conductive adhesive 21 to the upper surfaces of the package connection terminals 20C-3 formed on the stepped surface 20*b* of a semiconductor package 30. On the upper and bottom surfaces of the upper and lower semiconductor packages 30, 30', align keys in the shape of "+" or "□" are manufactured, and using the align keys, the above construction are aligned and stacked in the same method as the bonding of a semiconductor chip.

The molded body 23 of epoxy molding compound is formed on the upper surface of the substrates 20, 20' in such a manner that the semiconductor chips 22, 22' are surrounded or partially covered. The internal terminals 20*c*-1 and a plurality of the chip pads formed on the semiconductor chip 22, 22' are bonded to each other by a thermo-compression bonding with the conductive adhesive 21 of ACA or ACF using the ACA/ACF bonding or a bumpless process.

Copper (Cu) is used as a material for the internal and external terminals 20*b*-1, 20*b*-2, and the bonding strength is enhanced by planting Au or Ni layer on the resultant material. The internal terminals 20*b*-1, having protrusion structures, have thickness of about 5 to 100 μm, and the external terminals 20*b*-2 have thickness of about 10 to 400 μm. The desired distance between each adjoining external terminals 20*b*-2 is at least about 10 μm. In addition, the desired area of the internal and external terminals 10*b*-1, 10*b*-2 is more than about 0.2 mm×0.2 mm.

As described above, since the semiconductor package according to the present invention adopts an ACA/ACF bonding technique when connecting an internal terminal and a chip pad without a wire bonding, the distance between each chip pad can be reduced from about 150~200 μm to about 30~40 μm. In addition, since internal and external terminals, which are smaller than that of the conventional solder ball can be fabricated, it is easy to manufacture a semiconductor package having more than 500 pins, and a bump of a chip pad is not necessary. The ACA/ACF bonding of the chip pad makes the fabrication process simplified, and since the semiconductor chip is mounted in the cavity formed at the center of the upper surface of the substrate, the chip is safely protected. Consequently, the semiconductor package has a low height, resulting in a thinner package. Since a plurality of chips can be mounted and a multi-layer package can be manufactured, an integrated multi-layer package can be achieved.

The foregoing embodiment is merely exemplary and not to be construed as limiting the present invention. The present scheme can be readily applied to other types of packages requiring large number of pin count. The description of the present invention is intended to be illustrative, and not limiting the scope of the claims. Many alternatives, modifications and variations will be apparent to those skilled in the art.

I claim:

1. A semiconductor package comprising:

(a) a first semiconductor package having a substrate having an upper surface with a stepped cavity formed therein, the stepped cavity having a bottom surface and a stepped surface, a stepped lower surface, and a plurality of leads formed internally in said substrate, said substrate including:
  - a plurality of first terminals formed on said bottom surface of said stepped cavity, each first terminal being connected with corresponding ones of the internal leads,
  - a plurality of second terminals formed on said lower stepped surface of said substrate, each second terminal being connected with a corresponding first terminal via a corresponding internal lead,
  - a plurality of third terminals formed on said stepped surface of said stepped cavity, and
  - a conductive adhesive material applied on a surface of each of said plurality of first terminals;

(b) an integrated chip having a plurality of bonding pads, said integrated chip being placed on said conductive adhesive material such that corresponding bond pads therefor are coupled to corresponding ones of the first terminals; and (c) a molding compound filling said stepped cavity to a predetermined height.

2. The semiconductor package of claim 1, further comprising a second semiconductor package, having substantially the same substrate structure as said first semiconductor package stacked thereon, wherein said third terminals of said first semiconductor package are connected with corresponding second terminals of said second semiconductor package.

3. The semiconductor package of claim 1, wherein said plurality of first and second terminals comprise a plurality of protrusions extending beyond a plane of said bottom surface of the stepped cavity and the stepped lower surface of the substrate, respectively.

4. The package of claim 3, wherein each of said plurality of protrusions has a square surface area.

5. The package of claim 4, wherein said square surface area is at least 0.04 $mm^2$.

6. The package of claim 3, wherein said first terminals have a thickness of about 5 to 100 microns.

7. The package of claim 3, wherein said second terminals have a thickness of about 10 to 400 microns.

8. The package of claim 1, wherein a distance between adjacent second terminals is at least 10 microns.

9. The package of claim 1, wherein each of said plurality of first terminals further includes at least one of Au and Ni layer on said surface.

10. The package of claim 1, wherein said first and second terminals are made of copper.

11. The package of claim 1, wherein said conductive adhesive is one of anisotropic conductive adhesive and anisotropic conductive film.

12. The package of claim 1, wherein said plurality of leads comprises multi-layers of copper wires.

13. The package of claim 1, wherein said molding compound fills said cavity such that said integrated chip is encapsulated.

14. The package of claim 1, wherein said predetermined height equals the depth of said first cavity.

15. The package of claim 1, wherein said molding compound fills up to said predetermined height of said cavity such that a top surface of said integrated chip is exposed.

* * * * *